United States Patent [19]

Taguchi

[11] Patent Number: 4,635,085
[45] Date of Patent: Jan. 6, 1987

[54] SEMICONDUCTOR MEMORY DEVICE
[75] Inventor: Masao Taguchi, Sagamihara, Japan
[73] Assignee: Fujitsu Limited, Kawasaki, Japan
[21] Appl. No.: 508,501
[22] Filed: Jun. 28, 1983
[30] Foreign Application Priority Data Jun. 30, 1982 [JP] Japan .................................. 57-113239

[51] Int. Cl.⁴ ........................ H01L 29/94; H01L 29/46
[52] U.S. Cl. .................................. 357/23.6; 357/23.1;
357/41; 357/59; 357/49; 357/29
[58] Field of Search ....................... 357/23.6, 23.1, 41,
357/49, 59, 29; 365/149

[56] References Cited
U.S. PATENT DOCUMENTS

| 3,387,286 | 6/1968 | Dennard | 357/23.6 |
| 3,573,509 | 4/1971 | Crawford | 307/303 |
| 4,163,245 | 7/1979 | Kinoshita | 357/23.6 |
| 4,355,374 | 10/1982 | Sakai et al. | 357/23.6 |
| 4,419,682 | 12/1983 | Masuoka | 357/23.6 |
| 4,419,743 | 12/1983 | Taguchi et al. | 357/23.6 |
| 4,424,526 | 1/1984 | Dennard et al. | 357/23.6 |

FOREIGN PATENT DOCUMENTS

| 55-146956 | 11/1980 | Japan | 357/29 |
| 55-156358 | 12/1980 | Japan . | |
| 56-43753 | 4/1981 | Japan | 357/23.6 |

OTHER PUBLICATIONS

McNutt, "Buried Channel Charge Transfer Device (CTD) Transient Radiation Hardening Using N-P-N Structures", IEEE Trans. on Nuclear Sci., vol. NS-27, No. 5, Oct. 1980, pp. 1338-1342.
Minato et al, "2K×8 Bit Hi-CMOS Static Ram's", IEEE Trans. on Elec. Devices, vol. ED-27, No. 8, Aug. 1980, pp. 1591-1595.
Wordeman et al, IEEE IEDM, Tech. Digest, Dec. 1981, pp. 40-43.

Primary Examiner—Andrew J. James
Assistant Examiner—Charles S. Small, Jr.
Attorney, Agent, or Firm—Staas & Halsey

[57] ABSTRACT

The soft-error in an MOS d-RAM can be reduced by an impurity-doped region having a conductivity opposite to that of a substrate. The impurity-doped region is formed in the substrate and below and in contact with a field oxide layer formed on the substrate, for collecting minority carriers produced by incident radiation. A storage capacitor is formed on the field oxide layer for shielding the minority carriers. This device has the further advantage of not decreasing the density of a memory cell array.

14 Claims, 26 Drawing Figures (a)

(b)

(c)

SEMICONDUCTOR MEMORY DEVICE

BACKGROUND OF THE INVENTION (1) Field of the Invention

The present invention relates to a semiconductor memory device, more particularly to a semiconductor memory device such as a dynamic random access memory (d-RAM) which has a protective structure against soft errors caused by radiation from a package incident on memory cells.

(2) Description of the Prior Art

Metal oxide semiconductor (MOS) d-RAMs have recently come into wide use as semiconductor memories. Such MOS d-RAMs, however, suffer from the problem of soft errors induced by alpha particles. These alpha particles result from the alpha decay of atoms such as uranium and thorium contained in the package material of the semiconductor memory device. The alpha particles incident on the memory cells can produce electron-hole pairs and may destroy information stored in the memory cells.

An MOS d-RAM comprises a plurality of memory cells comprises a switching transistor and a storage capacitor, the storage capacitor comprises an insulating film formed on a semiconductor substrate, a cell plate formed on the insulating film, and a depletion region or a storage node disposed below the insulating film in the semiconductor substrate.

When electron-hole pairs are produced by penetration of alpha particles into the semiconductor substrate, majority carriers flow to an electrode on the bottom of the substrate, but minority carriers diffuse in the substrate during their life-times. If the minority carriers reach the depletion region, they are collected there to neutralize carriers stored therein, lowering the potential of the storage node. Therefore, when a storage node in a memory cell collects minority carriers produced by incident alpha rays, the output voltages of the memory cell may be lowered and obscured by noise so that the stored information cannot be discriminated. Sometimes, the output voltages may be changed to the opposite polarity so that the stored information is made different from the original information.

To resolve the problem, it has been proposed to provide protective structures to prevent collection of radiation-induced carriers in storage nodes. In one proposal, an epitaxial layer is formed on the semiconductor substrate, the conductivity of the epitaxial layer being opposite to that of the substrate, and the MOS d-RAM is formed in and on the epitaxial layer (see M. J. McNutt, IEEE Trans. on Nuc. Sci., NS-27, No. 5, pp 1138–1342, 1980). In another proposal, a buried grid or layer is formed in a semiconductor substrate by an ultra high energy ion-implantation, the conductivity of the grid or layer being opposite to that of the substrate. The MOS d-RAM is then formed in and on the substrate so that the grid or layer is separated from the storage nodes formed in the substrate (see Japanese Unexamined Patent Publication (Kokai) No. 55-156358; M. R. Wordeman et al, "A Buried N-Grid for Protection Against Radiation Induced Charge Collection in Electronic Circuits", IEEE IEDM 81, pp 40–43, 1981). The first proposal significantly increases the cost of the memory device since it necessitates the addition of an epitaxial semiconductor layer, which is not usually used in an MOS type semiconductor memory device. As for the second proposal, formation of a buried grid or layer in a semiconductor substrate by ultra high energy ion-implantation deteriorates the quality of crystals of the semiconductor substrate resulting in, for example, lower device gain.

SUMMARY OF THE INVENTION

An object of the present invention is to provide a semiconductor memory device including memory cells comprising a switching transistor and a storage capacitor, in which the storage capacitor is protected against minority carriers produced by radiation incident in the cell without forming an epitaxial layer and without forming a buried grid or layer by ultra high-energy ion-implantation.

This and other objects, features, and advantages of the present invention are achieved by providing a semiconductor memory device including memory cells comprising a switching transistor and a storage capacitor. The storage capacitor is located over an insulating layer on a semiconductor substrate. The memory cells include, an impurity-doped region of a conductivity opposite to that of the substrate, formed below and in contact with the insulating layer, for collecting minority carriers.

In accordance with the present invention, an impurity-doped region of a conductivity type opposite to that of the semiconductor substrate for collecting minority carriers is formed in the substrate adjacent to the surface of the substrate. The conventional epitaxial layer or an ultra high energy ion-implantation is not needed in this device.

However, the area of a memory cell will increase if an impurity-doped region for collecting minority carriers, i.e., a getter region, is formed in addition to a storage node in one plane since the conductivity of the getter region is the same as that of the storage node. To avoid this, a storage capacitor, including a storage node, is formed on an insulating layer, for example, a so-called field oxide layer, which is formed on the substrate, and a getter region is formed in the substrate, below and in contact with the insulating layer. Thus, a getter region is arranged below a storage capacitor, preventing an increase in the area of the memory cell because both regions are arranged in a plane.

Further, in accordance with the present invention, since a storage capacitor is arranged on an insulating layer, collection of minority carriers by the storage node of the storage capacitor is prevented by the insulating layer inserted between the storage node and the semiconductor substrate in which the minority carriers are produced and diffuse toward the storage node.

BRIEF DESCRIPTION OF THE DRAWINGS

The present invention will now be described in more detail below with reference to the drawings, in which.

DESCRIPTION OF THE PREFERRED EMBODIMENTS

Before describing the preferred embodiments of the invention, a description of the prior art will be made with reference to the drawings.

Figure 1:
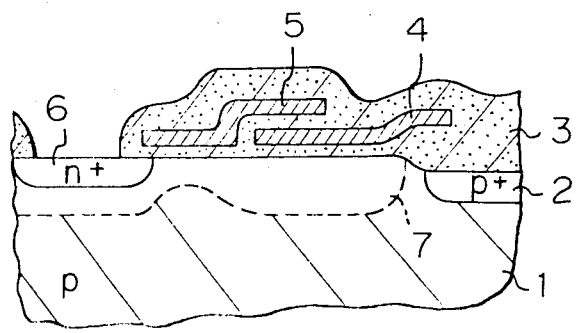
FIG. 1 is a cross-sectional view of a prior art memory cell of an MOS d-RAM.

FIG. 1 is a memory cell of a prior art MOS d-RAM, in which 1 denotes a p-type silicon semiconductor substrate, 2 a p+-type channel cut region, 3 a silicon dioxide insulating layer, 4 a cell plate of polysilicon as a memory capacitor electrode, 5 a transfer gate of polysilicon, 6 an n+-type bit-line contact and source or drain region, and 7 a depletion region including a storage node of the memory capacitor. As can be seen from FIG. 1, the storage node 7 is not protected from diffusion of minority carriers in the substrate 1, and there is no getter region, i.e., no n+-type region for collecting minority carriers in the substrate.

Figure 2:
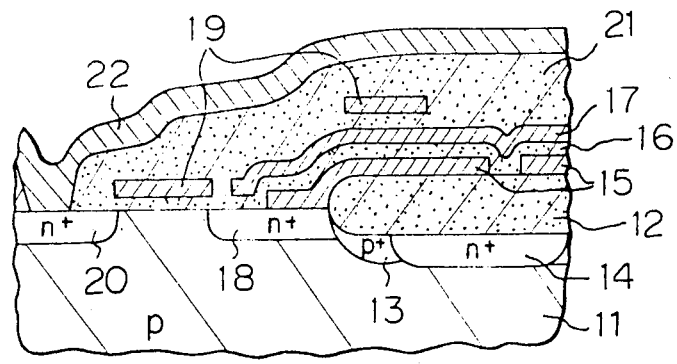
FIG. 2 is a cross-sectional view of a memory cell of an MOS d-RAM according to an embodiment of the present invention.

FIG. 2 is a memory cell of an MOS d-RAM according to the present invention. In this memory cell, the surface of a p-type silicon semiconductor substrate 11 has a selectively formed field oxide layer 12 of silicon dioxide having a thickness of, for example, 5000 Å, in contact with a p+-type channel cut region 13 which is arranged below the field oxide layer. Also below and in contact with the field oxide layer 12 is an n+-type getter region 14 for collecting minority carriers produced in the substrate 11 by incident radiation. Further, a storage capacitor is arranged on the field oxide layer 12. The storage capacitor comprises a storage node 15 of a first polysilicon film, an insulating film 16 of silicon dioxide as an intermediate dielectric layer of a capacitor formed on the storage node 15 and the field oxide layer, and a cell plate 17 of a second polysilicon film formed on the insulating film 16. Alternatively, the storage node 15 and/or cell plate 17 may be of metal silicide. The insulating film 16 may be of silicon nitride. The storage node 15 is electrically connected to an active region of the substrate 11, i.e., a switching transistor, through an n+-type contact region 18 in the substrate 11.

The other parts are similar to the prior art device and include a transfer gate 19 of polysilicon formed on the insulating layer of silicon dioxide on the substrate, an n+-type bit-line contact and source or drain region 20 formed in the substrate 11 and near the transfer gate 19, an insulating layer 21 of silicon dioxide formed on the cell plate 17 and the transfer gate 19, and a bit line 22 of aluminum formed on the insulating layer 21, the bit line 22 being electrically connected to the n+-type contact region 20. The n+-type contact region 18 electrically connected to the storage node 15 functions as either one of a source or drain, and the n+-type bit-line contact region 20 functions as the other one of the source and drain. The transfer gate 29 functions as a gate for the source and drain mentioned above. The transfer gate 19 also functions as a word line of the d-RAM.

The n+-type getter region 14 for collecting minority carriers may be electrically connected to a power source or the ground by making a contact therebetween at the outside of the memory cell array. If connected to a power source, the ability of the getter region 14 to collect minority carriers increases due to the formation and expansion of a depletion layer between the getter region 14 and the substrate 11. However, if a depletion layer expands near the storage node 15, punch through may occur between the contact region 18 and the depletion layer, resulting in charges stored in the storage node 15 moving to the getter region 14. In such a case, the getter region 14 may be connected to ground. Further, the getter region 14 may be in a floating state without application of a bias voltage thereto. In the last case, minority carriers collected by the getter region 14 diffuse into the entire region of the getter region 14 and move into other getter regions 14 having a higher bias voltage. Therefore, although minority carriers are not removed from the entire region of the assembly of getter regions 14, a storage node 15 can be substantially protected from effects of the minority carriers.

Figure 3:
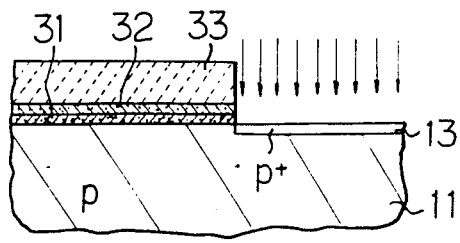
FIGS. 3 to 11 are cross-sectional views of the memory cell in FIG. 2 during fabrication.

The fabrication process of the MOS d-RAM in FIG. 2 is explained below. Referring to FIG. 3, on the surface of a p-type silicon substrate 11 having a crystal orientation of (001) face and a 10 Ωcm-resistivity, a silicon dioxide film 31 of 500 Å thickness and a silicon nitride film 32 of 1000 Å thickness are selectively formed by using a photoresist 33 having a thickness of 2 μm as a mask for selective etching. Using the resist mask 33, implantation of boron ions is conducted at an energy of 40 keV and at a dose of $2\times10^{14}$ to $2\times10^{15}$ cm$^{-2}$ to form a p+-type channel cut region 13.

Figure 4:
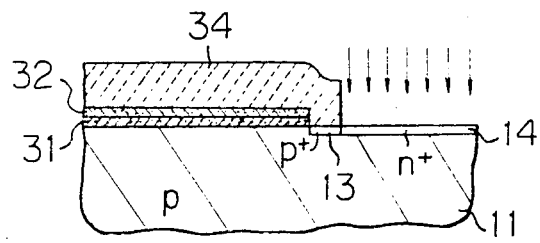

In FIG. 4, a new patterned resist mask 34 having a thickness of 2 μm is formed on the films 31 and 32 and a part of the substrate 11. Arsenic ions are then implanted at 120 keV and $5\times10^{14}$ cm$^{-2}$ to form an n+-type getter region 14 in the central major portion of the channel-cut ion-implanted region 13.

Figure 5:
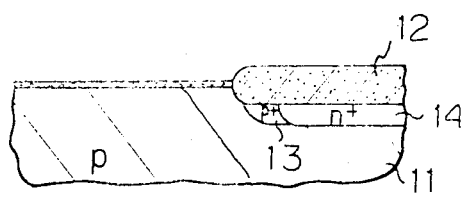

In FIG. 5, the resist mask for ion-implantation is removed. Then, a field oxide layer 12 of silicon dioxide having a thickness of 5000 Å is selectively formed on the channel cut region 13 and the getter region 14 by oxidation at a temperature of 1000° C. After this oxidation, the channel cut region 13 and the getter region 14 are 0.8 μm (micrometer) and 0.3 μm in depth, respectively.

Figure 6:
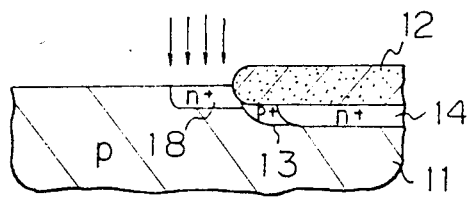

In FIG. 6, an n+-type contact region 18 is formed in the substrate 11 and adjacent to the field oxide layer 12 by implantation of arsenic ions at 120 keV and $1\times10^{14}$ cm$^{-2}$.

Figure 7:
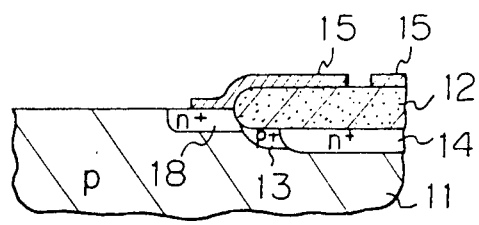

In FIG. 7, an arsenic ion or phosphorus doped polysilicon film is deposited and patterned on the n+-type contact region 18 and the field oxide layer 14, to form a storage node 15 of a storage capacitor, the polysilicon film having a thickness of 1000 Å and a sheet resistance of 200 Ω/□ to 1 kΩ/□.

Figure 8:
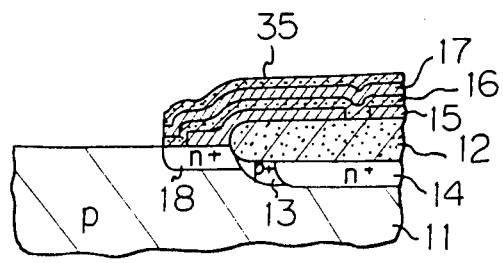

In FIG. 8, the surface of the storage node 15 is oxidized to form an insulating layer 16 as a capacitor oxide layer having a thickness of 200 Å. A second polysilicon film is then deposited on the insulating film 16 to form a cell plate 17. The cell plate 17 has a thickness of 3000 Å and a sheet resistance of 20 Ω/□. A 2000 Å-thick silicon dioxide film 35 is deposited on the cell plate 17.

Figure 9:
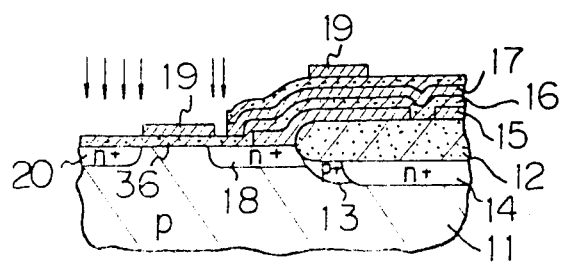

In FIG. 9, the surface of the substrate 11 other than the region of the field oxide layer 12 and the storage capacitor, i.e., the region where a switching transistor is to be formed, is oxidized to form a silicon dioxide film 36 having a thickness of 300 Å. A transfer gate 19, i.e., a word line, is formed on the film 36 and the storage capacitor by sputter-depositing a MoSi$_2$ layer having a thickness of 3000 Å and a sheet resistance of 5 Ω/□ and patterning it, the width of the gate 19 being 1.5 μm. Arsenic ion implantation is, then, conducted at 120 keV and $2 \times 10^{15}$ cm$^{-2}$ to form n$^+$-type source and drain regions, that is a source (or drain) region 20, i.e., a bit-line contact region, and a drain (or source) region of a part of the region 18.

Figure 10:
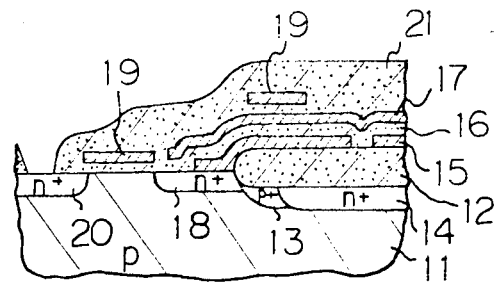

In FIG. 10, an insulating layer 21 is formed by depositing a silicon dioxide layer having a thickness of 1 μm on the transfer gate 19, etc. Then, a window is opened in the insulating layer 21 by reactive etching of CHF$_3$.

Figure 11:
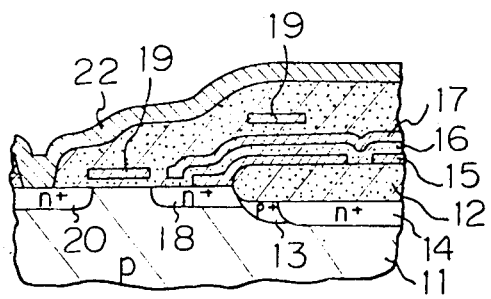

In FIG. 11, a layer of aluminum containing silicon in the amount of 5% and having a thickness of 1 μm is sputter-deposited on the entire surface and is then patterned to be a bit line 22.

In FIGS. 2 to 11, the switching transistor and storage capacitor are illustrated as if they are arranged in a line or a plane. In practice, however, they are arranged in a different form for the benefit of dense packing.

Figure 12:
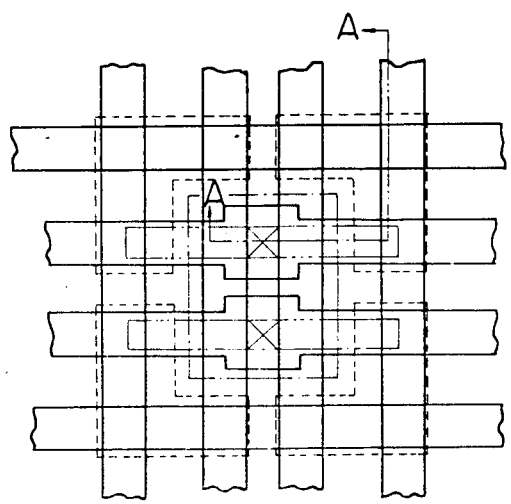
FIG. 12 is a layout of a memory cell corresponding to that in FIG. 2.
Figure 13:
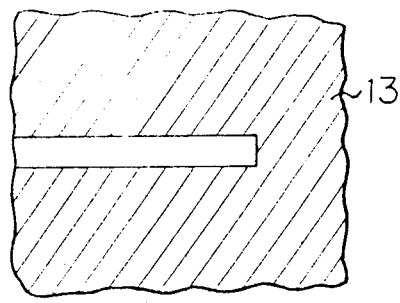
FIGS. 13 to 21 are plan views of a pattern of a different part in each of FIGS. 3 to 11.
Figure 14:
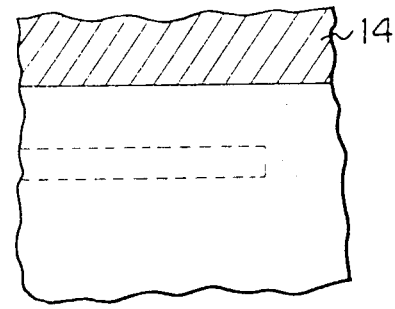
Figure 15:
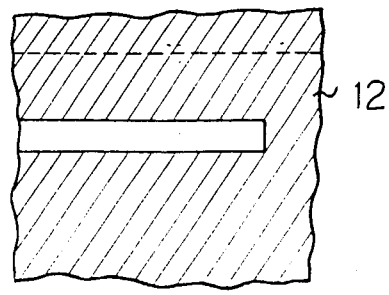
Figure 16:
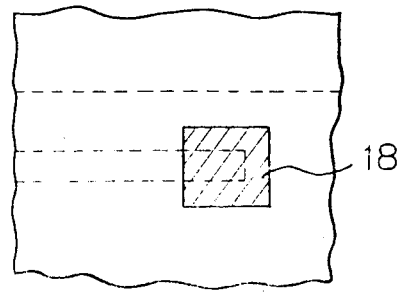
Figure 17:
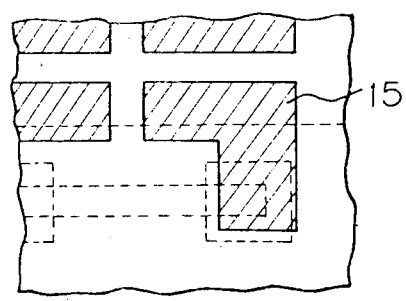
Figure 18:
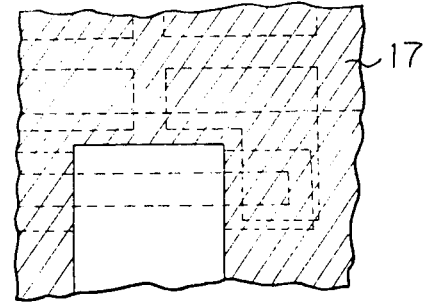
Figure 19:
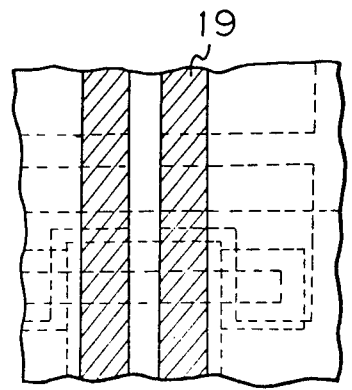
Figure 20:
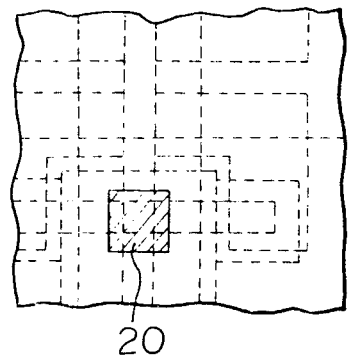
Figure 21:
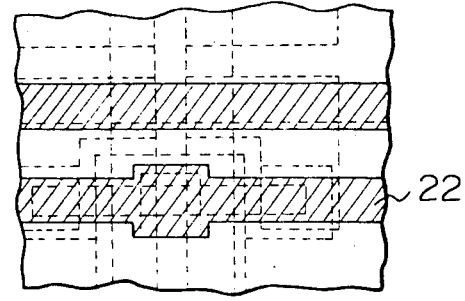

FIG. 12 is a practical layout of memory cells according to the present invention, the layout includes four memory cells. FIG. 2 substantially corresponds to a sectional view taken along the dot-dash line A—A in FIG. 12. FIGS. 13 to 21 correspond to FIGS. 3 to 11 respectively and show, by hatching, the pattern which is most characteristic in each of FIGS. 3 to 11. These hatched patterns are a channel cut region 13 in FIG. 13, a getter region 14 in FIG. 14, a field oxide layer 12 in FIG. 15, an n$^+$-type contact region 18 in FIG. 16, a storage node 15 in FIG. 17, a cell plate 17 in FIG. 18, a word line 19 in FIG. 19, a bit-line contact region 20 in FIG. 20, and a bit line 22 in FIG. 21.

In this layout, the field oxide layer occupies a very large area of the memory cell. Almost all of the area of the storage capacitor, except for an area for contacting between the capacitor and the substrate, is superposed on the large field oxide layer. Also, the large field oxide layer allows a large area of a getter region to be arranged therebelow.

Figure 22:
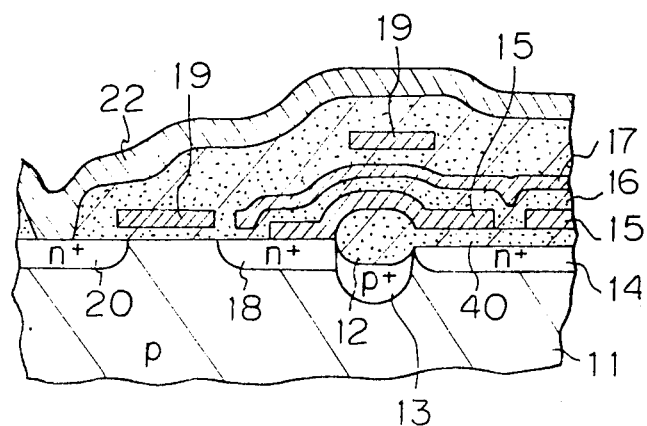
FIG. 22 is a cross-sectional view of a memory cell of a MOS d-RAM according to another embodiment of the present invention.

FIG. 22 is another embodiment of the present invention. This embodiment is similar to the previous embodiment except that a field oxide layer 12 has a central portion 40 having a thickness of, for example, 200 Å, so that a storage node 15, a getter region 14, and the central portion 40 of the field oxide layer 12 form a storage capacitance. Thus, the overall capacitor of the two storage capacitors in a memory cell increases. The central portion 40 may be a silicon nitride or tantalum oxide layer instead of a silicon dioxide layer.

Figure 23:
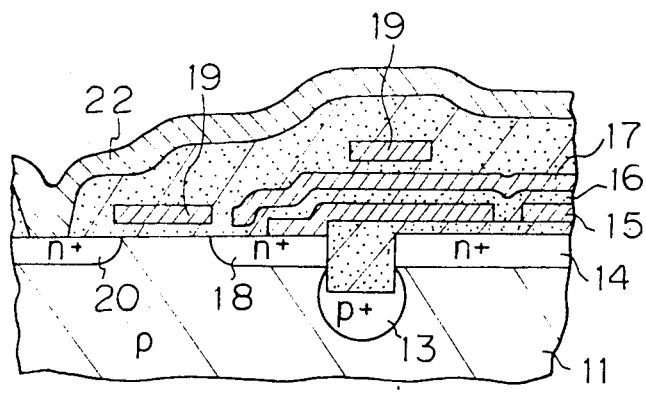
FIG. 23 is a cross-sectional view of a memory cell of a MOS d-RAM according to another embodiment of the present invention.
Figure 24:
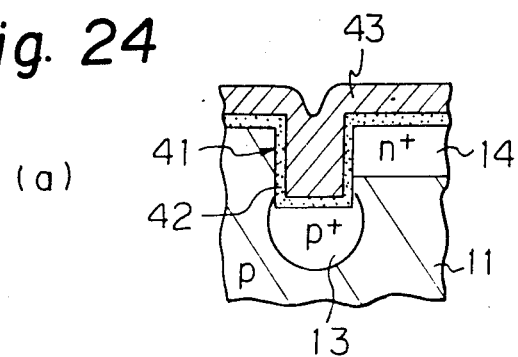
FIGS. 24(a)–(c) are steps in a process for fabricating a part of the memory cell in FIG. 23.
Figure 24:
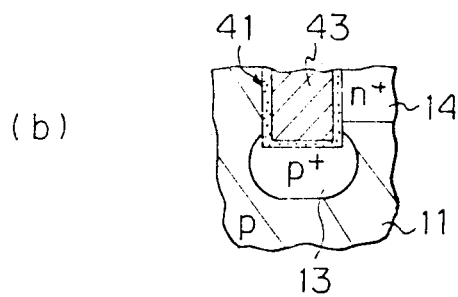
Figure 24:
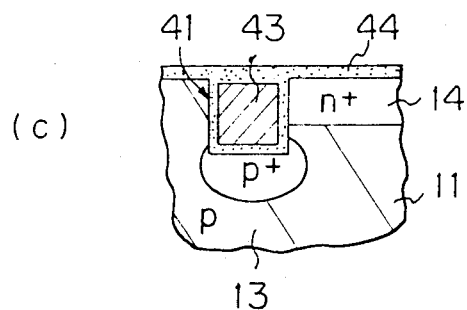

FIGS. 23 and 24 are embodiments similar to that in FIG. 22. In FIG. 23, many parts are similar to corresponding parts in FIG. 22, 11 denoting a substrate, 13 a channel cut region, 15 a storage node, 16 a capacitor dielectric film, 17 a cell plate, 18 a contact region, 19 a transfer gate, and 20 a contact region. Referring to FIG. 24, a p-type silicon semiconductor substrate 11 having an n$^+$-type getter region 14 is subjected to selective etching to form a groove 41 having a depth of 1 to 2 μm. In the bottom of the groove 41, boron ions are implanted to form a p$^+$-type channel cut region 13. The surface 42 of the substrate 11 in the groove 41 is oxidized and the groove 41 is then filled with polysilicon 43 by a chemical vapor deposition procedure. The polysilicon layer over the substrate 11 and in the groove 41 is then etched. Then the surfaces of the polysilicon 42 and the substrate 11 are oxidized to form a silicon dioxide layer 44 having a thickness of 200 Å thickness. The subsequent process is similar to that of the embodiment shown in FIG. 2 or 22.

The capability of this device is similar to that of the device in FIG. 22.

I claim:

1. A semiconductor memory device including memory cells formed in a semiconductor substrate, and an insulating layer formed on the semiconductor substrate, each of the memory cells comprising:
   a switching transistor formed in the semiconductor substrate; and
   a storage capacitor, formed in and on the semiconductor substrate and on the insulating layer, an impurity-doped getter region of a conductivity type opposite to that of the semiconductor substrate being formed in the semiconductor substrate, in contact with the insulating layer, and below said storage capacitor, for collecting minority carriers so as to avoid soft errors.

2. A semiconductor memory device according to claim 1, operatively connectable to a power supply, wherein said impurity-doped getter region for collecting minority carriers is connected to one of the potentials of the power supply.

3. A semiconductor memory device according to claim 1, further comprising a plurality of the impurity-doped getter regions formed in the semiconductor substrate, in contact with the insulating layer and below said storage capacitor, wherein said plurality of impurity-doped getter regions for collecting minority carriers are connected to each other and are in a floating state.

4. A semiconductor memory device according to claim 1, further comprising a channel cut region having a conductivity opposite that of said impurity-doped getter region and highly doped with an impurity, wherein said impurity-doped getter region is surrounded by said channel cut region.

5. A semiconductor memory device according to claim 1, wherein the semiconductor substrate includes an active region formed therein, and wherein said storage capacitor comprises a silicon dioxide layer formed on the semiconductor substrate, and upper and lower layers of polysilicon for forming electrodes for sandwiching the silicon dioxide layer, the lower polysilicon layer of the storage capacitor contacting the active region of the semiconductor substrate.

6. A semiconductor memory device according to claim 1, wherein said storage capacitor comprises a silicon dioxide layer, a layer of polysilicon forming an electrode and a layer of metal silicide forming an electrode, both the polysilicon and metal silicide layers sandwiching the silicon dioxide layer.

7. A semiconductor memory device according to claim 1, wherein said storage capacitor comprises a silicon nitride layer, a layer of polysilicon forming a first electrode and a layer of metal silicide forming a second electrode, said first and second electrodes sandwiching the silicon nitride layer.

8. A semiconductor memory device according to claim 1, wherein said storage capacitor comprises a polysilicon layer and two layers of metal silicide forming electrodes sandwiching the polysilicon layer.

9. A semiconductor memory device according to claim 1, wherein said storage capacitor comprises a silicon nitride layer and two layers of metal silicide forming electrodes sandwiching the silicon nitride layer.

10. A semiconductor memory device according to claim 1, wherein the semiconductor substrate is a p-type silicon semiconductor substrate.

11. A semiconductor memory device according to claim 4, further comprising a field oxide layer having a peripheral portion and a central portion, the central portion of the field oxide layer being formed between said storage capacitor and said impurity-doped getter region and being thinner than the peripheral portion of the field oxide layer, said channel cut region being formed below the peripheral portion, and said impurity-doped getter region being formed below the central portion, whereby an electrode of said storage capacitor formed contacting the insulating layer, the central portion of the field oxide layer, and said impurity-doped getter region form said storage capacitor of each of the memory cells.

12. A semiconductor device according to claim 11, wherein the central and peripheral portion of said field oxide layer have an entirely flat upper surface and a major part of the peripheral portion of said field oxide layer is located in the semiconductor substrate.

13. A semiconductor memory device including memory cells formed in a semiconductor substrate, comprising:
- an impurity-doped region formed in the semiconductor substrate, having a conductivity type opposite that of the semiconductor substrate, for collecting minority carriers;
- a channel cut region formed in the semiconductor substrate adjacent to and contacting said impurity doped region;
- a field oxide layer formed on said impurity-doped region and said channel cut region;
- a first polysilicon film selectively formed on said field oxide layer and the semiconductor substrate;
- an insulating film formed on said field oxide layer and said first polysilicon film; and
- a second polysilicon film formed on said insulating film.

14. A semiconductor memory device according to claim 13, wherein the memory cells comprise a switching transistor and a storage capacitor and wherein said storage capacitor comprises said first polysilicon film, said insulating film and said second polysilicon film.

* * * * *

UNITED STATES PATENT AND TRADEMARK OFFICE
CERTIFICATE OF CORRECTION

PATENT NO. : 4,635,085
DATED : JANUARY 6, 1987
INVENTOR(S) : MASAO TAGUCHI

It is certified that error appears in the above-identified patent and that said Letters Patent is hereby corrected as shown below:

```
Col. 2, line 22, "include," should be --include--.

Col. 5, line 45, "capacitance" should be --capacitor--;
        line 45, "capacitor" should be --capacitance--.
```

Signed and Sealed this

Twenty-eighth Day of April, 1987

Attest:

DONALD J. QUIGG

*Attesting Officer*    *Commissioner of Patents and Trademarks*